US009552652B2

(12) United States Patent
Thoma et al.

(10) Patent No.: US 9,552,652 B2
(45) Date of Patent: Jan. 24, 2017

(54) IMAGE ENCODER AND IMAGE DECODER

(75) Inventors: Herbert Thoma, Erlangen (DE); Ajit Motra, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 455 days.

(21) Appl. No.: 13/547,195

(22) Filed: Jul. 12, 2012

(65) Prior Publication Data

US 2013/0177240 A1 Jul. 11, 2013

Related U.S. Application Data

(63) Continuation of application No. PCT/EP2010/070915, filed on Dec. 30, 2010.

(30) Foreign Application Priority Data

Jan. 19, 2010 (EP) .................................. 10151074

(51) Int. Cl.
  *G06K 9/00* (2006.01)
  *G06T 9/00* (2006.01)
  *H03M 7/24* (2006.01)
  *H04N 19/64* (2014.01)
  *H04N 19/40* (2014.01)

(52) U.S. Cl.
  CPC ............... *G06T 9/007* (2013.01); *H03M 7/24* (2013.01); *H04N 19/40* (2014.11); *H04N 19/647* (2014.11)

(58) Field of Classification Search
  CPC combination set(s) only.
  See application file for complete search history.

(56) References Cited

U.S. PATENT DOCUMENTS 5,528,741 A   6/1996  Lucas
6,131,104 A  10/2000  Oberman
            (Continued)

FOREIGN PATENT DOCUMENTS

JP   6-309146 A   11/1994
JP   2002-77619 A   3/2002
            (Continued)

OTHER PUBLICATIONS

Xu et al. "High-Dynamic-Range Still-Image Encoding in JPEG 2000" 2005.*
            (Continued)

*Primary Examiner* — Alex Liew
(74) *Attorney, Agent, or Firm* — Keating & Bennett, LLP

(57) ABSTRACT

An image encoder includes an extreme value determiner, a floating point-to-integer converter and an encoder. The extreme value determiner determines minimal and maximal values of a floating point image value of each pixel of a part of an image, an image or a group of images. The floating point-to-integer converter maps the floating point image value of each pixel to an integer image value. The minimal floating point image value is mapped to a minimal integer image value of a predefined range of integer image values and the maximal floating point image value is mapped to a maximal integer image value of the predefined range of integer image values. The encoder encodes the integer image value of each pixel to obtain and provide encoded image data of the part of the image, the image or the group of images.

13 Claims, 8 Drawing Sheets

(56) References Cited

U.S. PATENT DOCUMENTS

| | | | |
|---|---|---|---|
| 6,292,815 | B1 | 9/2001 | Abdallah et al. |
| 7,554,557 | B2 | 6/2009 | Wu |
| 2002/0039453 | A1 | 4/2002 | Naiki et al. |
| 2005/0013501 | A1 | 1/2005 | Kang et al. |
| 2005/0055389 | A1* | 3/2005 | Ramanujam ........ G06F 9/30014 708/204 |
| 2006/0047734 | A1 | 3/2006 | Blainey et al. |
| 2007/0201560 | A1 | 8/2007 | Segall et al. |
| 2007/0258641 | A1* | 11/2007 | Srinivasan .............. H03M 7/24 382/166 |
| 2009/0002207 | A1* | 1/2009 | Harada ................ H03M 7/3086 341/51 |
| 2009/0046207 | A1 | 2/2009 | Salvucci |
| 2009/0322777 | A1* | 12/2009 | Lu ............................ G06T 9/00 345/582 |
| 2013/0129239 | A1* | 5/2013 | Fukuhara ................ G06K 9/36 382/233 |
| 2013/0177240 | A1* | 7/2013 | Thoma .................... H03M 7/24 382/166 |
| 2013/0322532 | A1 | 12/2013 | Efremov et al. |

FOREIGN PATENT DOCUMENTS

| | | |
|---|---|---|
| JP | 2005-236588 A | 9/2005 |
| JP | 2007-243942 A | 9/2007 |
| JP | 2009-524371 A | 6/2009 |
| RU | 2 335 017 C2 | 9/2008 |

OTHER PUBLICATIONS

Larson "The LogLuv Encoding for Full Gamut, High Dynamic Range Images" 1999.*

Kwon et al. "Exposure-adaptive Color Image Enhancement" 2009.*

Official Communication issued in International Patent Application No. PCT/EP2010/070915, mailed on Apr. 8, 2011.

Xu et al., "High-Dynamic-Range Still-Image Encoding in JPEG 2000," IEEE Computer Graphics and Applications, vol. 25, No. 6, Nov. 1, 2005, pp. 57-64, New York, NY.

Larson, "LogLuv Encoding for Full-Gamut, High-Dynamic Range Images," Journal of Graphics Tools, Association for Computing Machinery, vol. 3, No. 1, Jan. 22, 1999, pp. 15-31, New York, NY.

Krawczyk et al., "Perceptual Effects in Real-Time Tone Mapping," In SCCG '05: Proc. of the 21st Spring Conference on Computer Graphics, 2005, 8 pages.

Larson et al., "Overcoming Gamut and Dynamic Range Limitation in Digital Images," Proceedings of the Sixth Color Imaging Conference, Nov. 1998, 6 pages.

Okuda et al., "Effective Color Space Representation for Wavelet Based Compression of HDR Images," 14th International Conference on Image Analysis and Processing, 2007, 5 pages.

Springer et al., "Lossy Compression of Floating Point High Dynamic Range Images Using JPEG2000," Visual Communications and Image Processing, vol. 7257, 72570X, 2009, 11 pages.

* cited by examiner ial Application No. PCT/EP2010/070915, filed Dec. 30, 2010, which is incorporated herein by reference in its entirety, and additionally claims priority from European Application No. EP 10151074.1, filed Jan. 19, 2010, which is also incorporated herein by reference in its entirety.

BACKGROUND OF THE INVENTION

Embodiments according to the invention relate to image/video encoding or decoding and, particularly, to an image encoder and an image decoder as well as a method for providing encoded image data and a method for decoding image data.

The human eye can accommodate luminance in a single view over a range of about 100,000:1 and is capable of distinguishing about 10,000 colors at a given brightness. By comparison, typical computer monitors have a luminance range less than 100:1 and cover about half of the visible color gamut. Despite this difference, most digital image formats are geared to the capabilities of conventional displays, rather than the characteristics of human vision.

Recently, there has been an increased interest in high dynamic range (HDR) images, both captured and synthetic, which permit extended processing and higher fidelity display methods.

HDR images store scene referred images (e.g. "Krawczyk, G., Myszkowski, K., and Seidel, H.-P. 2005 "Perceptual effects in real-time tone mapping." In SCCG '05: Proc. Of the $21^{st}$ Spring Conference on Computer Graphics, 195.202.") rather than display referred images. Such images can cover a dynamic range from faint starlight ($10^{-6}$ cd/m$^2$) to bright sunlight ($10^8$ cd/m$^2$). Eyes can simultaneously perceive dynamic range of five orders of magnitude which is 100,000:1. In order to accommodate such a high dynamic range, most commonly used HDR image formats like e.g. openEXR store images in a triplet of floating point numbers per pixel.

A LogLuv transform (e.g. "Larson, G. W., "Overcoming Gamut and Dynamic Range Limitations in Digital Images," Proceedings of the Sixth Color Imaging Conference, November 1998.", "N. Adami, M. Okuda, "Effective color space representation for wavelet based compression of HDR images," International Conference on Image Analysis and Processing, Modena (2007)", "D. Springer, A. Kaup," Lossy Compression of Floating Point High Dynamic Range Images JPEG2000, "International Conference on Image Analysis and Processing, Modena (2007)") method transforms floating point pixels into integer pixels. Such a scheme starts with transforming floating point RGB values into device independent XYZ color space. Then, XYZ color space is transformed into integer LogLuv color space. For Luminance channel a log based transformation is used. For color channels CIEuv representation is used.

SUMMARY

According to an embodiment, an image encoder may have: an extreme value determiner configured to determine a minimal value and a maximal value of a floating point image value of each pixel of a part of an image, an image or a group of images, wherein the floating point image value of each pixel represents a luminance value of each pixel; a floating point-to-integer converter configured to map the floating point image value of each pixel to an integer image value, wherein each integer image value lies in a predefined range of integer image values, wherein the determined minimal floating point image value is mapped to a minimal integer image value of the predefined range of integer image values and the determined maximal floating point image value is mapped to a maximal integer image value of the predefined range of integer image values, wherein the floating point-to-integer converter is configured to calculate at least one transform parameter for the part of the image, the image or the group of images based on the determined minimal floating point value and the determined maximal floating point value, wherein the floating point value of each pixel of the part of the image, the image or the group of images is mapped based on the transform parameter; and an encoder configured to encode the integer image value of each pixel to obtain and provide encoded image data of the part of the image, the image or the group of images, wherein the transform parameter is provided with the encoded image data of the part of the image, the image or the group of images.

According to another embodiment, a method for providing encoded image data may have the steps of: determining a minimal value and a maximal value of a floating point image value of each pixel of a part of an image, an image or a group of images, wherein the floating point image value of each pixel represents a luminance value of each pixel; calculating at least one transform parameter for the part of the image, the image or the group of images based on the determined minimal floating point value and the determined maximal floating point value; mapping the floating point image value of each pixel to an integer image value, wherein each integer image value lies in a predefined range of integer image values, wherein the determined minimal floating point image value is mapped to a minimal integer image value of the predefined range of integer image values and the determined maximal floating point image value is mapped to a maximal integer image value of the predefined ranged of integer image values, wherein the floating point value of each pixel of the part of the image, the image or the group of images is mapped based on the transform parameter; encoding the integer image value of each pixel to obtain encoded image data of the part of the image, the image or the group of images; and providing the encoded image data, wherein the transform parameter is provided with the encoded image data of the part of the image, the image or the group of images.

According to another embodiment, a method for decoding image data may have the steps of: decoding received encoded image data to obtain an integer image value for each pixel of a part of an image, an image or a group of images and to obtain a transform parameter of the part of the image, the image or the group of images, wherein the integer image value of each pixel represents a luminance value of each pixel; and mapping the integer image value of each pixel to a floating point image value based on the transform parameter, wherein each floating point image value lies in a range of floating point image values, wherein the range of floating point image value depends on the transform parameter.

Another embodiment may have a computer program with a program code for performing the inventive methods, when the computer program runs on a computer or a microcontroller.

An embodiment of the invention provides an image encoder comprising an extreme value determiner, a floating point-to-integer converter and an encoder. The extreme value determiner is configured to determine a minimal value and a maximal value of a floating point image value of each pixel of a part of an image, an image or a group of images. Further, the floating point-to-integer converter is configured to map the floating point image value of each pixel to an integer image value. Each integer image value lies in a predefined range of integer image values. The determine minimal floating point value is mapped to a minimal integer image value of the predefined range of integer image values and the determined maximal floating point value is mapped to a maximal integer image value of the predefined range of integer image values. Additionally, the encoder is configured to encode the integer image value of each pixel to obtain and provide encoded image data of the part of the image, the image or the group of images.

Embodiments according to the present invention are based on the central idea that the floating point to integer conversion is adapted to the distribution of floating point values of pixels within a part of an image, an image or a group of images. In other words, a range of floating point values is mapped to a range of integer values by which the range of integer values may be dynamically adapted to the range of floating point values. By this, a better resolution may be reached, if the floating point values are only distributed over a narrow range of floating point values, compared with a concept using a static mapping. By increasing the resolution of the floating point to integer conversion the image quality of images with a narrow distribution of floating point values may be significantly improved.

Further a reduced amount of image data may be necessitated for providing an increased resolution for images with a narrow distribution of floating point values in comparison to concepts using static mapping, since these known methods would have to provide the high resolution for a whole allowed range of floating point values, which would increase the amount of necessitated image data significantly.

A further embodiment of the invention provides an image decoder comprising a decoder and an integer-to-floating point converter. The decoder is configured to decode received encoded image data to obtain an integer image value for each pixel of a part of an image, an image or a group of images and to obtain a transform parameter of the part of the image, the image or the group of the images. Further, the integer-to-floating point converter is configured to map the integer image value of each pixel to a floating point image value based on the transform parameter, wherein each floating point image value lies in a range of floating point image values, wherein the range of the floating point image values depends on the transform parameter.

The image decoder is based on the same central idea as the described image encoder. The range of the integer image values is adapted to the range of floating point values of the original image. Therefore, a transfer parameter is contained by the encoded image data to consider the dynamic relation between the range of integer image values and the range of floating point image values. So, a better resolution may be reached, if the floating point values are only distributed over a narrow range of floating point values, compared with a concept using a static mapping. By increasing the resolution of the floating point to integer conversion the image quality of images with a narrow distribution of floating point values may be significantly improved.

In some embodiments according to the invention the floating point image value of each pixel and the integer image value of each pixel represents an luminance value of each pixel. Often parts of images, images or groups of images contain pixels with luminance values in a narrow range compared with the range of possible luminance values. Therefore, an adaptation of the range of integer values to the range of floating point luminance values may significantly improve the resolution, wherein the amount of image data is not increased.

Some embodiments according to the invention relate to a determination of a logarithmic value for the floating point value of each pixel, so that the floating point values are distributed logarithmically through the range of integer values. By a logarithmic mapping the human vision may be considered more accurate.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
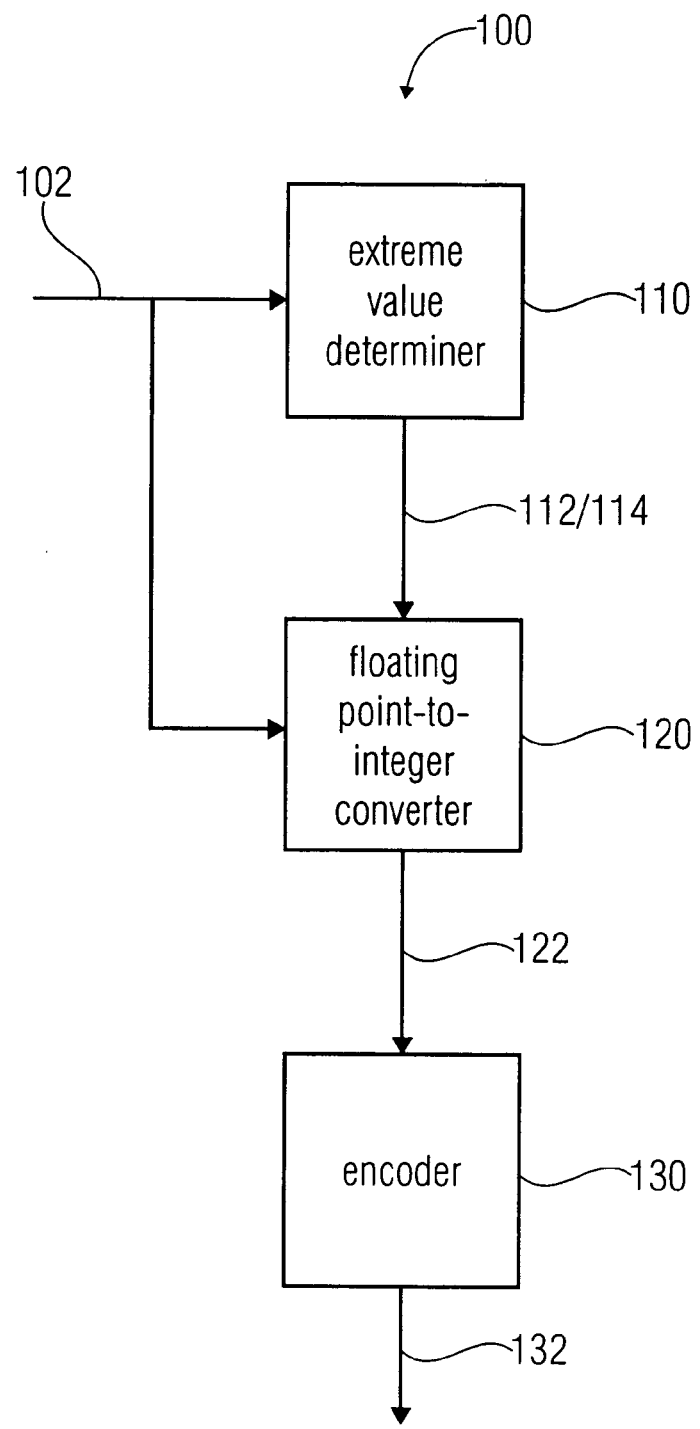
FIG. 1 is a block diagram of an image encoder.

In the following, the same reference numerals are partly used for objects and functional units having the same or similar functional properties and the description thereof with regard to a figure shall apply also to other figures in order to reduce redundancy in the description of the embodiments.

FIG. 1 shows a block diagram of an image encoder 100 according to an embodiment of the invention. The image encoder 100 comprises an extreme value determiner 110, a floating point-to-integer converter 120 and an encoder 130. The extreme value determiner 110 is connected to the floating point-to-integer converter 120 and the floating point-to-integer converter 120 is connected to the encoder 130. The extreme value determiner 110 determines a minimal value 112 and a maximal value 114 of a floating point image value 102 of each pixel of a part of an image, an image or a group of images. Further, the floating point-to-integer converter 120 maps the floating point image value 102 of each pixel to an integer image value 122, wherein each integer image value 122 lies in a predefined range of integer image values. The determined minimal floating point value 112 is mapped to a minimal integer image value of the predefined range of integer image values and the determined maximal floating point value 114 is mapped to a maximal integer image value of the predefined range of integer image values. Additionally, the encoder 130 encodes the integer image values 122 of each pixel to obtain and provide encoded image data 132 of the part of the image, the image or the group of the images.

The minimal value 112 and the maximal value 114 of the floating point image values define a range of floating point image values. The floating point image values of all pixels of the part of the image, the image or the group of images lie in this range of floating point image values. This range of floating point values is mapped to the range of integer image values by assigning the minimal floating point value 112 to a minimal integer image value of the predefined range of integer image values and assigning the maximal floating point value 114 to the maximal integer image value of the predefined range of integer image values. In this way, a varying range of floating point image values may be mapped to a constant predefined range of integer image values of the part of the image, the image or the group of images.

For example, the predefined range of integer image values may reach from 0 to 255, from 0 to 1024, from 0 to 4096 or even more (starting from 0 is not mandatory). In other words, the integer image values lying in the predefined range of integer image values may be, for example, 8 bit, 9 bit, 10 bit, 12 bit or 14 bit (or even higher) integer values.

By using the described concept, a better resolution may be reached. By increasing the resolution of the floating point to integer conversion the image quality of images with a narrow distribution of floating point values may be significantly improved.

Further a reduced amount of image data may be necessitated for providing an increased resolution for images with a narrow distribution of floating point values in comparison to concepts using static mapping, since these known methods would have to provide the high resolution for the whole allowed range of floating point image values, which would increase the amount of necessitated image data significantly.

For example, the possible allowed floating point image values for an image may reach for 0 to 10,000, but the pixels of the image comprise only floating point image values from 7000 to 8000. Then a minimal value of 7000 and a maximal value of 8000 would be determined. So, according to the described concept, only the floating point values between 7000 and 8000 would be mapped to the range of integer image values, which may reach, for example, from 0 to 1000. In contrast, known methods would map the full range of possible floating point image values, namely 0 to 10,000, to the range of integer image values. Therefore, for this example, the resolution reached by the described concept would be ten times higher than a resolution of a known method. Providing the same resolution with a known static mapping would necessitate a ten times larger range of integer image values and therefore also an increased amount of image data.

A floating point image value may be any floating point color space parameter as, for example, a parameter in the RGB color space (red, green, blue), a parameter in the CMY color space (cyan, magenta, yellow), a parameter in the CMYK color space (cyan, magenta, yellow, key), a parameter in the CIE-XYZ color space (CIE, International Commission of an Illumination) or a parameter in the CIE-Luv color space.

An integer image value may be any integer color space parameter of a color space. For example, an integer image value may be an integer color space parameter of the color space also represented by the floating point image value.

The encoder 130 may be, for example, an entropy encoder, a differential encoder, an MPEG-encoder an H.262 or H.264-encoder.

The extreme value determiner 110, the floating point-to-integer converter 120 and the encoder 130 may be independent hardware units, part of a digital signal processor, a microcontroller or a computer or a computer program or a software product for running on a computer or a microcontroller.

The extreme value determiner 110 may determine a minimal value 112 and a maximal value 114 for each part of an image, for each image of a group of images or for each group of images of an image sequence or a video. In this way, the range of floating point image values may be adapted dynamically to the range of integer image values. So, for each part of an image, for each image or for each group of images, the resolution for the floating point image value may be optimized. In connection with videos, images may be also called frames.

In some embodiments according to the invention, the floating point-to-integer converter 120 may calculate at least one transfer parameter for the part of the image, the image or the group of images. The transform parameter may indicate the link between the range of the floating point image values and the range of the integer image values. Therefore, the transform parameter may be calculated based on the determined minimal floating point value and the determined maximal floating point value. Then, the floating point image value 102 of each pixel of the part of the image, the image or the group of images may be mapped based on the transform parameter. Additionally, the transform parameter may be provided with the encoded image data 132 of the part of the image, the image or the group of images. In this way, an image decoder may use the transform parameter in combination with the integer image value of each pixel to reconstruct image.

According to another aspect, the floating point-to-integer converter 120 may determine a logarithmic value of the floating point image value of each pixel and map the logarithmic floating point image values to the integer image values, so that the floating point image values are distributed logarithmically through the range of the integer image values. For this, the determined minimal value may be a minimal positive value of the floating point image values. By using a logarithmic scale for the distribution of the floating point image values to the range of integer image values human vision may be better taken into account, so that the achievable quality for the human perception may be improved.

Alternatively, the floating point image value of each pixel may of course also be mapped to the integer image values without determining a logarithmic value in a non-logarithmic way.

In some embodiments according to the invention, the floating point image value of each pixel represents a luminance value of each pixel. Since the luminance value of pixels of a part of an image, an image or a group of images are often limited to a restricted range of values, an adaptation of the mapping of the range of the floating point image values to the range of integer image values for floating point luminance image values may lead to a significantly improved resolution.

Further, additionally to the floating point luminance image value, each pixel may comprise two floating point chrominance image values as, for example, defined by the CIE-XYZ color space or the CIE-Luv color space.

Additionally, an image encoder may also comprise a color space converter for transforming color space parameters from one color space to color space parameters of another color space.

Figure 2:
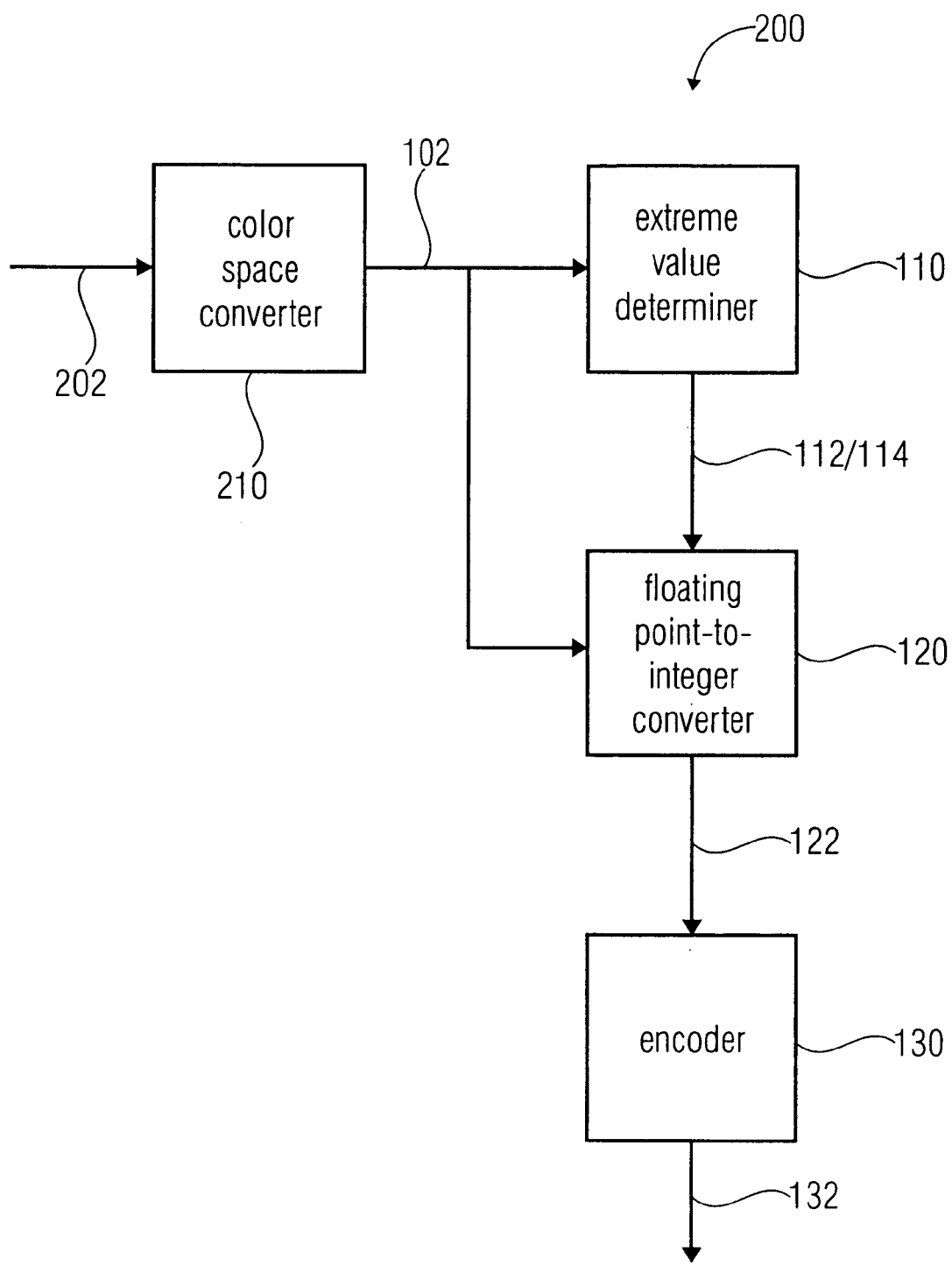
FIG. 2 is a block diagram of an image encoder.

FIG. 2 shows a block diagram of an image encoder 200 according to an embodiment of the invention. The image encoder 200 is similar to the encoder shown in FIG. 1, but comprises additionally a color space converter 210. The color space converter 210 is connected to the extreme value determiner 110 and the floating point-to-integer converter 120. The color space converter 210 may transform color space parameters 202 of any color space to color space parameters of any other color space.

For example, the color space converter 210 may transform device dependent floating point image data 202 (e.g. RGB color space parameters or CMYK color space parameters) to device independent floating point image data 102 (e.g. CIE-XYZ color space parameters or CIE-Luv color space parameters). In this example, the device dependent floating point image data may comprise values of three floating point parameters for each pixel and the device independent floating point data may comprise a floating point luminance image value and two floating point chrominance image values for each pixel. An adaptive mapping according to the proposed concept may be applied, for example, to all three color space parameters or only to the floating point luminance image values.

The color space converter 210 may provide floating point color space parameters to the extreme value determiner 110 and the floating point-to-integer converter 120, so that an adaptive floating point-to-integer mapping or transformation according to the described concept may be realized.

Figure 3:
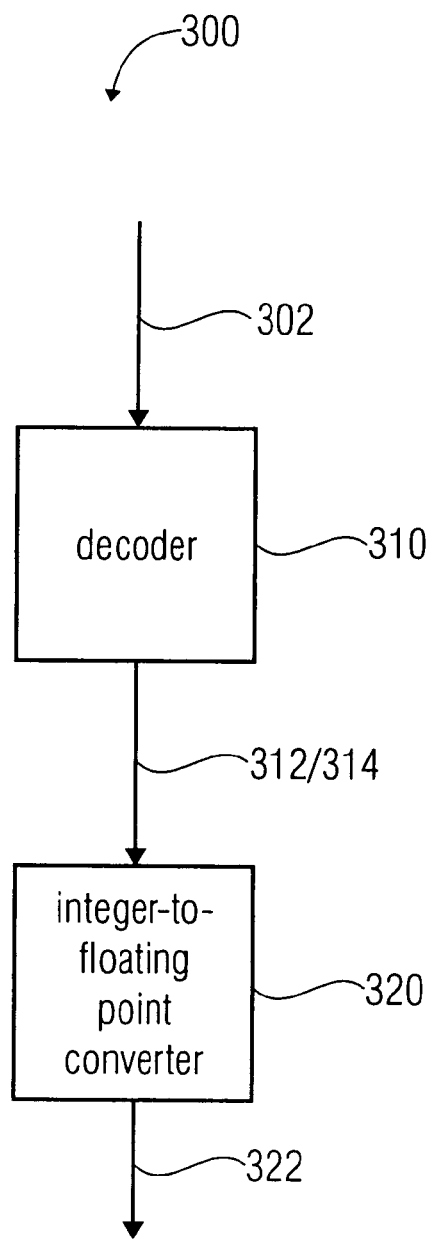
FIG. 3 is a block diagram of an image decoder.

FIG. 3 shows a block diagram of an image decoder 300 according to an embodiment of the invention. The image decoder 300 comprises a decoder 310 connected to an integer-to-floating point converter 320. The decoder 310 decodes received encoded image data 302 to obtain an integer image value 312 for each pixel of a part of an image, an image or a group of images and to obtain a transform parameter 314 of the part of the image, the image or the group of images. Further, the integer-to-floating point converter 320 maps the integer image value 312 of each pixel to a floating point image value 322 based on the transform parameter 314. Each floating point image value 322 lies in a range of floating point image values, the range of floating point image values depending on the transform parameter 314.

The integer-to-floating point converter 320 maps the range of integer image values to the range of floating point image values. Since the range of floating point image values depends on the transform parameter 314 and may vary between different parts of images, images or groups of images, the resolution of the mapping can be adapted to the range of floating point image values contained by the part of the image, the image or the group of images. In this way, a limited range of integer image values may be exploited more efficiently. Especially parts of images, images or groups of images with a narrow range of floating point images values can reach a high resolution for the floating point image values with a relatively low amount of image data.

As already described for the image encoder, the integer image value of each pixel may be a color space parameter of a color space (e.g. the luminance parameter of a CIE-Luv color space) and the floating point image value may be a corresponding floating point color space parameter of a color space (e.g. the Y component of the CIE-XYZ color space).

The transform parameter 314 may define a relation between a range of the integer image values of the pixels and the range of floating point image values of the pixels. The transform parameter 314 may be, for example, determined by an image encoder described above.

The received encoded image data 302 may contain more than one transform parameter 314 for the mapping of the integer image values 312 to the floating point image values 322.

The decoder 310 and the integer-to-floating point converter 320 may be independent hardware units, part of a digital signal processor, a computer or a microcontroller or a computer program or software product for running on a computer or a microcontroller.

As described for the image encoder, the integer image values may represent logarithmic values. This may be considered by the integer-to-floating point converter 320. In other words, the integer-to-floating point converter 320 may map the integer image value of each pixel to a floating point image value by considering the integer image values within an exponent.

Further, following the description of the image encoder, the integer image value of each pixel may represent, for example, a luminance value of each pixel. In this example, the integer-to-floating point converter 320 may map these integer luminance image values to floating point luminance image values.

According to another aspect, the image data 302 may comprise more than one integer image value for each pixel. For example, the image data 302 may comprise three integer image values for each pixel representing three color space parameters of a color space (e.g. CIE-Luv color space). The mapping of the integer image values to the floating point image values of at least one of these integer color space parameters depends on the transform parameter in a way, that the range of floating point image values depends on the transform parameter. For example, obtaining image values representing parameters of the CIE-Luv color space, the luminance parameter may be mapped in an adaptive way according to the described concept, while the chrominance parameters (u and v) may be mapped in an non-adaptive way.

Additionally, the image decoder may comprise a color space converter for transforming color space parameters (e.g. the floating point image value) of one color space to color space parameters of another color space.

Figure 4:
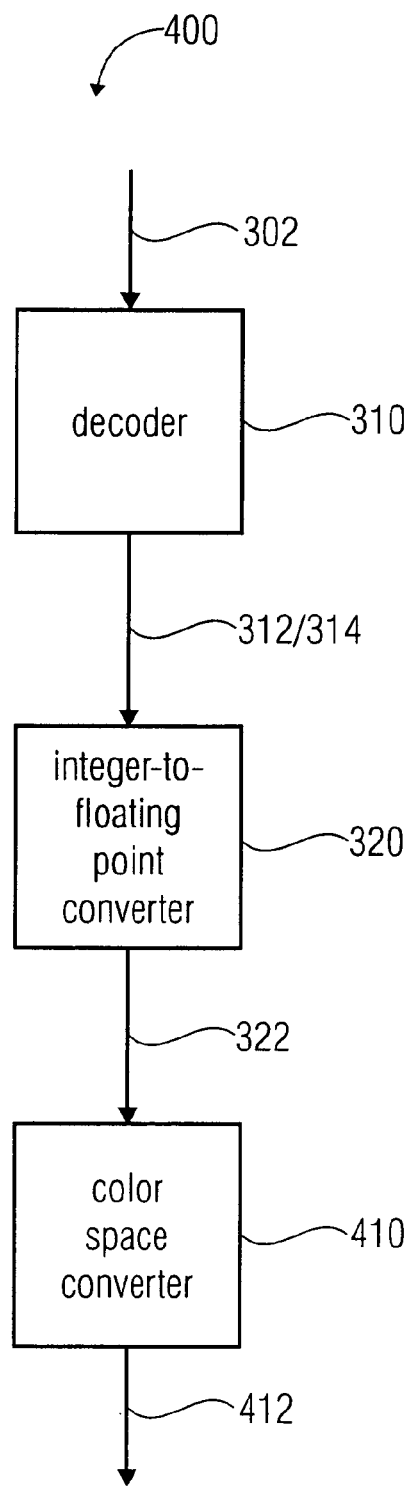
FIG. 4 is a block diagram of an image decoder.

FIG. 4 shows a block diagram of an image decoder 400 according to an embodiment of the invention. The image decoder 400 is similar to the decoder shown in FIG. 3, but comprises additionally a color space converter 410. The integer-to-floating point converter 320 is connected to this color space converter 410. The color space converter 410 may transform color space parameters 322 of any color space to color space parameters of any other color space.

For example, the color space converter 410 may transform device independent floating point image data (e.g. color space parameters of a CIE-Luv color space or CIE-XYZ color space) to device dependent floating point image data (e.g. color space parameters of an RGB color space or an CMYK color space). For example, the device independent floating point image data may comprise a floating point luminance image value and two floating point chrominance image values for each pixel, which are transformed to three floating point parameters for each pixel of the device dependent floating point image data.

Figure 5:
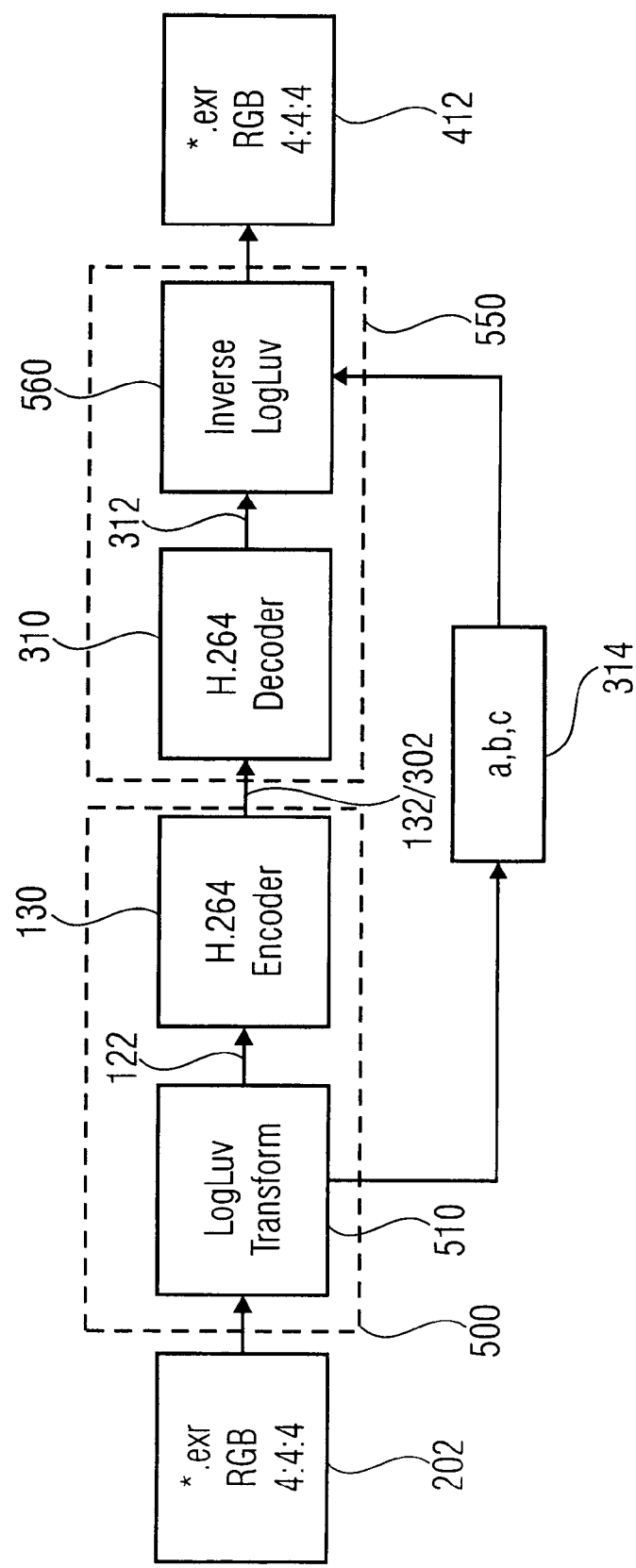
FIG. 5 is a block diagram of an image encoder and an image decoder.

FIG. 5 shows a block diagram of an image encoder 500 and a corresponding image decoder 550 according to an embodiment of the invention. In this example, the image encoder 500 comprises a LogLuv transformer 510 connected to an H.264 encoder 130. The LogLuv transformer 510 comprises an extreme value determiner, a floating point-to-integer converter and a color space converter.

The LogLuv transformer 510 receivers in this example high dynamic range image data 202. The high dynamic range image data 202 may be provided, for example, in a radiance HDR format, a portable float map, a TIFF format (tagged image file format) or an openEXR format (e.g. RGB 4:4:4). Additionally to the integer image values 122, the LogLuv transformer 510 may provide three transform parameters 314 (a, b, c). The transform parameters 314 may be encoded together with the integer image values 122 or may be provided without encoding together with the encoded image data 132.

The image decoder 550 comprises an H.264 decoder 310 connected to an inverse LogLuv transformer. The inverse LogLuv transformer comprises an integer-to-floating point converter 320 and a color space converter 410. The inverse LogLuv transformer receives decoded floating point image values 312 and three transform parameters 314 (a, b, c). Based on the decoded floating point image values and the transform parameters 314, the inverse LogLuv transformer provides in this example three device depending floating point parameters for each pixel representing high dynamic range image data. The high dynamic range image data may be provided in the same format as the input data of the image encoder 500 (e.g. RGB 4:4:4) or another mentioned format.

In the following a more detailed example for the mapping or transformation, which is done by an image encoder or an image decoder according to the described concept, is explained based on the proposed scheme illustrated in FIG. 5.

In this example, the input image data is provided as RGB data. This RGB floating point values may be transformed into device independent XYZ color space. Then minimum and maximum values of luminance available in groups of frames, frames or parts of frames are found. These values are then used to map the floating point luminance values into integer values as, for example, per following equations.

For encoding the image data, which is also called forward transformation, the following equations may be used:

$$\begin{bmatrix} X \\ Y \\ Z \end{bmatrix} = \begin{bmatrix} 0.497 & 0.339 & 0.164 \\ 0.256 & 0.678 & 0.066 \\ 0.023 & 0.113 & 0.864 \end{bmatrix} \begin{bmatrix} R \\ G \\ B \end{bmatrix}$$

$$x = \frac{X}{X+Y+Z}$$

$$y = \frac{Y}{X+Y+Z}$$

$$u_e = \left\lfloor c \frac{4x}{-2x+12y+3} \right\rfloor$$

$$v_e = \left\lfloor c \frac{9y}{-2x+12y+3} \right\rfloor$$

$$L = \begin{cases} 0, & \text{when } Y = 0 \\ \lfloor a(\log_2 Y + b) \rfloor, & \text{otherwise} \end{cases}$$

The decoding of the image data, which is also called inverse transformation, may be defined by the following equations:

$$Y = \begin{cases} 0, & \text{when } L = 0 \\ 2^{\left(\frac{L+0.5}{a}\right) - b}, & \text{otherwise} \end{cases}$$

$$u = \frac{u_e + 0.5}{c}$$

$$v = \frac{v_e + 0.5}{c}$$

$$x = \frac{9u}{6u - 16v + 12}$$

$$y = \frac{4v}{6u - 16v + 12}$$

$$X = \frac{Yx}{y}$$

$$Z = \frac{Y(1 - x - y)}{y}$$

$$\begin{bmatrix} R \\ G \\ B \end{bmatrix} = \begin{bmatrix} 2.690 & -1.276 & -0.414 \\ -1.022 & 1.978 & 0.044 \\ 0.061 & -0.224 & 1.163 \end{bmatrix} \begin{bmatrix} X \\ Y \\ Z \end{bmatrix}$$

For encoding and decoding the transform following transform parameters may be used:

$$a = \frac{2^{n_L} - 2}{\log_2(\max(Y)/\min\_positive(Y))}$$

$$b = \frac{1}{a} - \log_2(\min\_positive(Y))$$

$$c = \frac{2^{n_c} - 1}{0.62}$$

In this equations R, G and B are color space parameters of a device dependent color space, X and Z are color space parameters of a device independent color space, Y is the floating point luminance image value and x and y are two floating point chrominance image values of a device independent color space. Further, L is the integer luminance image value, a, b and c are transform parameters, $n_L$ is a number of bits per sample for a luma (luminance) channel (number of bits per pixel of the integer luminance image value), $u_e$ and $v_e$ are two integer chrominance image values, u and v are two floating point chrominance image values and $n_c$ is the number of bits per sample for chroma (chrominance) channels (number of bits per pixel of a integer chrominance image value).

The necessitated number of bits per sample for the luma channel $n_L$ may be, for example, 12 or 14 bits, while 8 bits may be sufficient for number of bits per sample for the chroma channels $n_C$ (which results in a constant c of 410).

In this example, floating point HDR images or video sequences may be transformed to integer images or video sequences that are then encoded using a traditional video encoder. The transform parameters (a, b, c) may be transmitted as side information in order to reconstruct the floating point HDR images or video sequences after decoding. These parameters can be chosen per parts of a frame (image), frame or group of frames. Parameter c may be, for example, set to a fixed value (e.g. 410, which represents 8 bits per chroma sample). In that case c does not need to be sent along with the bit stream (encoded image data).

Figure 6A:
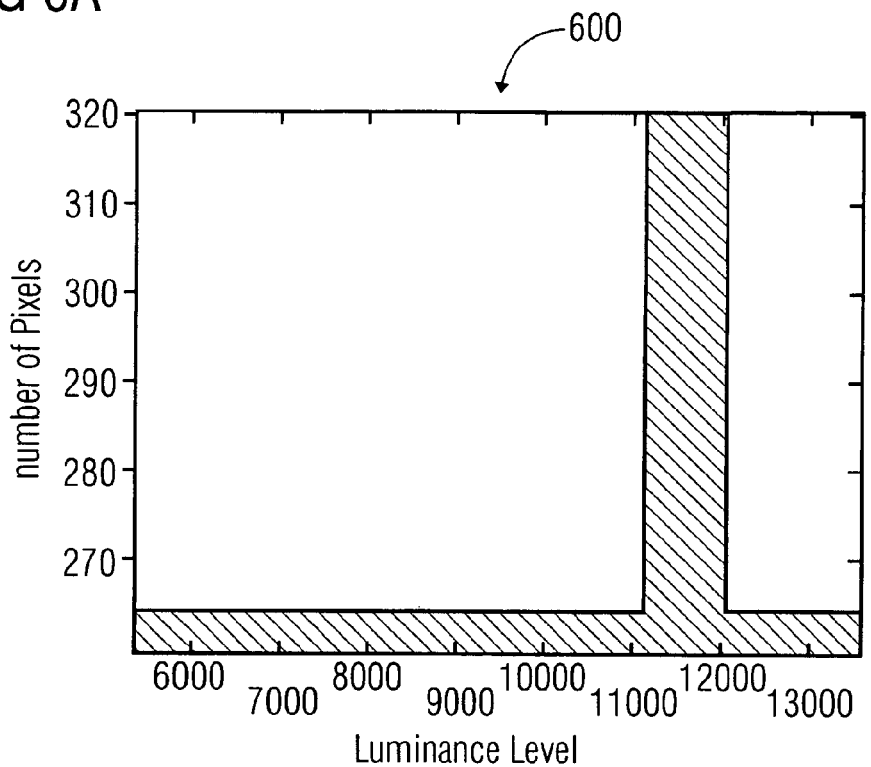
FIG. 6a is a schematic illustration of a histogram of a luminance of an image after a non-adaptive transformation.
Figure 6B:
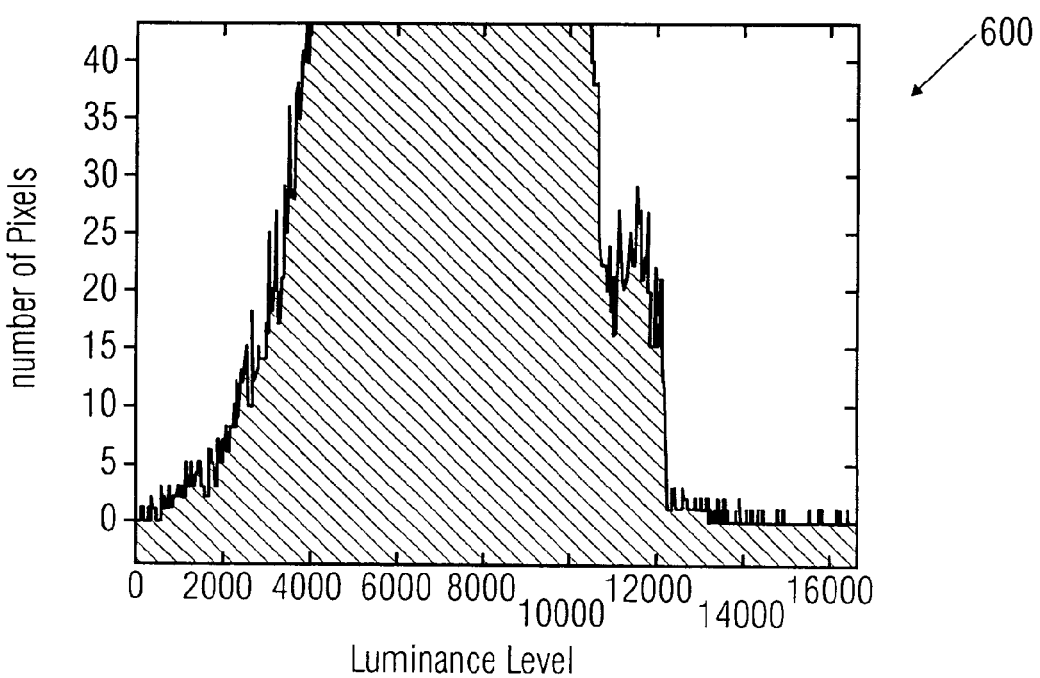
FIG. 6b is a schematic illustration of a histogram of a luminance of an image after adaptive transformation.

The following two figures (FIG. 6a, 6b) show the range of integer values of a HDR video frame after applying non-adaptive and adaptive log transform (according to the described concept). FIG. 6a shows an example for a histogram of luminance using known non-adaptive transformation. The x-axis indicates the luminance level and the y-axis illustrates the number of pixels comprising the corresponding luminance level. Fittingly, FIG. 6b shows an example for a histogram of luminance using an adaptive transformation. As shown in FIG. 6a, the non-adaptive log transform does not use all the available luminance levels. On the other hand, FIG. 6b shows that adaptive method uses more or all available luminance levels in the images.

In this example, for chroma (chrominance) channels a CIEuv representation is proposed, similar to non-adaptive transform method. However, other color transformations can also be used. Chroma channels are/can also be transmitted with lower bits per sample than the luma channel. Furthermore chroma subsampling like traditional 4:2:0 sampling can be employed.

Further, sRGB color space is used in this example. But the described concept is equally applicable to other color spaces like, for example, adobe RGB color space.

Some embodiments according to the invention relate to adaptive LogLuv transform for high dynamic range (HDR) video/image compression.

More general the described concept relates to image/video encoding/decoding. It maps floating point pixel values into integer values, taking into consideration the dynamic range of frame or part of frame (image). Existing video codecs like e.g. H.264 consider pixels as integer values. This transformation can be used along with existing encoder/decoder to encode, for example, high dynamic range images or video sequences efficiently, but also other image and video formats In other words, for example, floating point high dynamic range images or video sequences may be transformed to integer images of video sequences that are then encoded using a traditional video encoder. The proposed float to integer transform is adaptive with regard to the dynamic range of the luminance values of the high dynamic range images or video sequences.

Compared to known methods, the proposed scheme may provide significantly better results for individual frames/images not containing full dynamic range.

Figure 7:
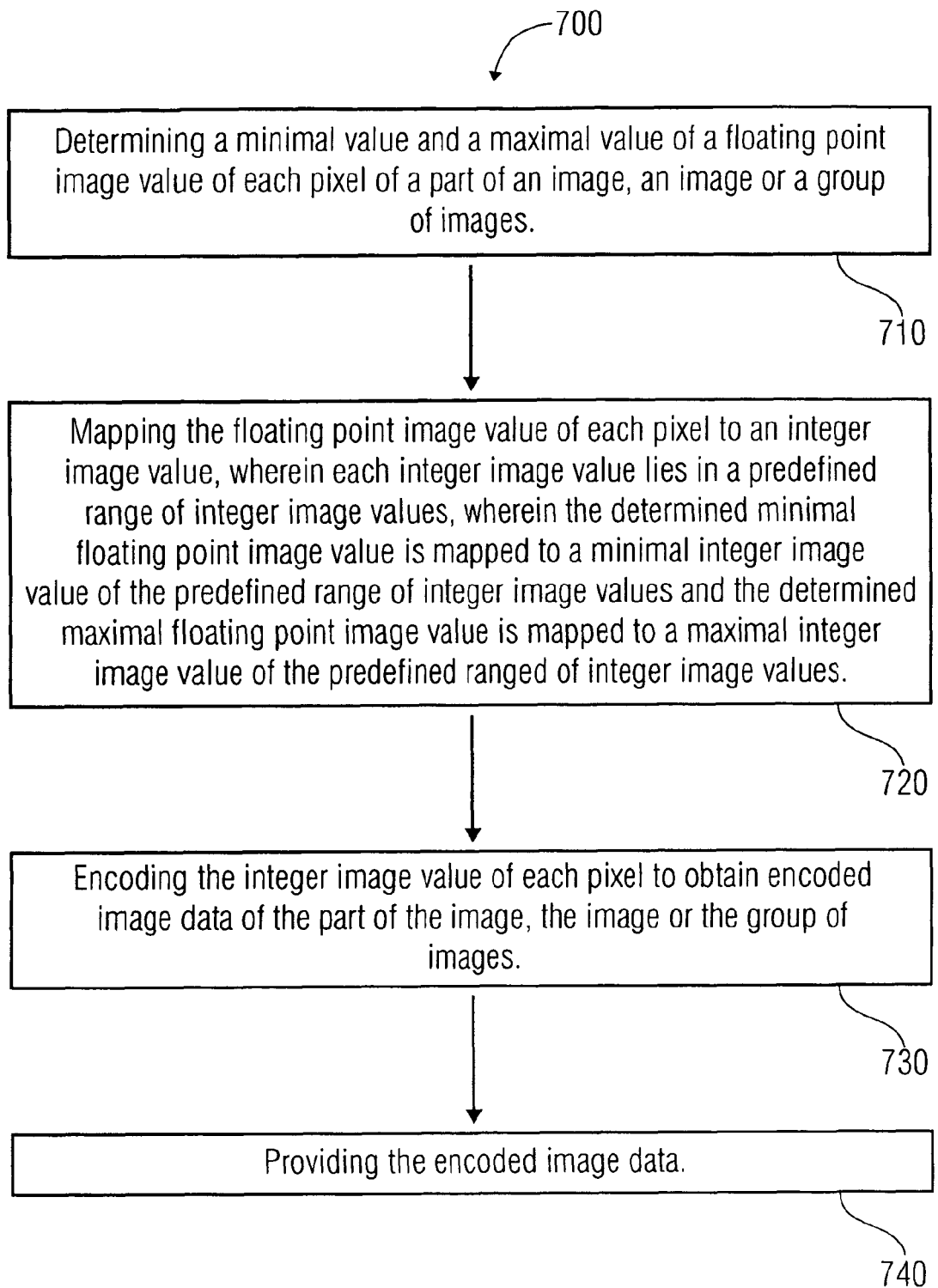
FIG. 7 is a flow chart of a method for providing encoded image data.

FIG. 7 shows a flow chart of a method 700 for providing encoded image data according to an embodiment of the invention. The method 700 comprises determining 710 a minimal value and a maximal value of a floating point image value of each pixel of a part of an image, an image or a group of images. Further, the method 700 comprises mapping 720 the floating point image value of each pixel to an integer image value. Each integer image value lies in a predefined range of integer image values. The determined minimal floating point value is mapped to a minimal integer image value of the predefined range of image integer values and the determined maximal floating point value is mapped to a maximal integer image value of the predefined range of integer image values. Additionally, the method 700 comprises encoding 730 the integer image value of each pixel to obtain encoded image data of the part of the image, the image or the group of images and providing 740 the encoded image data.

Additionally, the method 700 may comprise further optional steps, which are mentioned during the description of image encoders.

Figure 8:
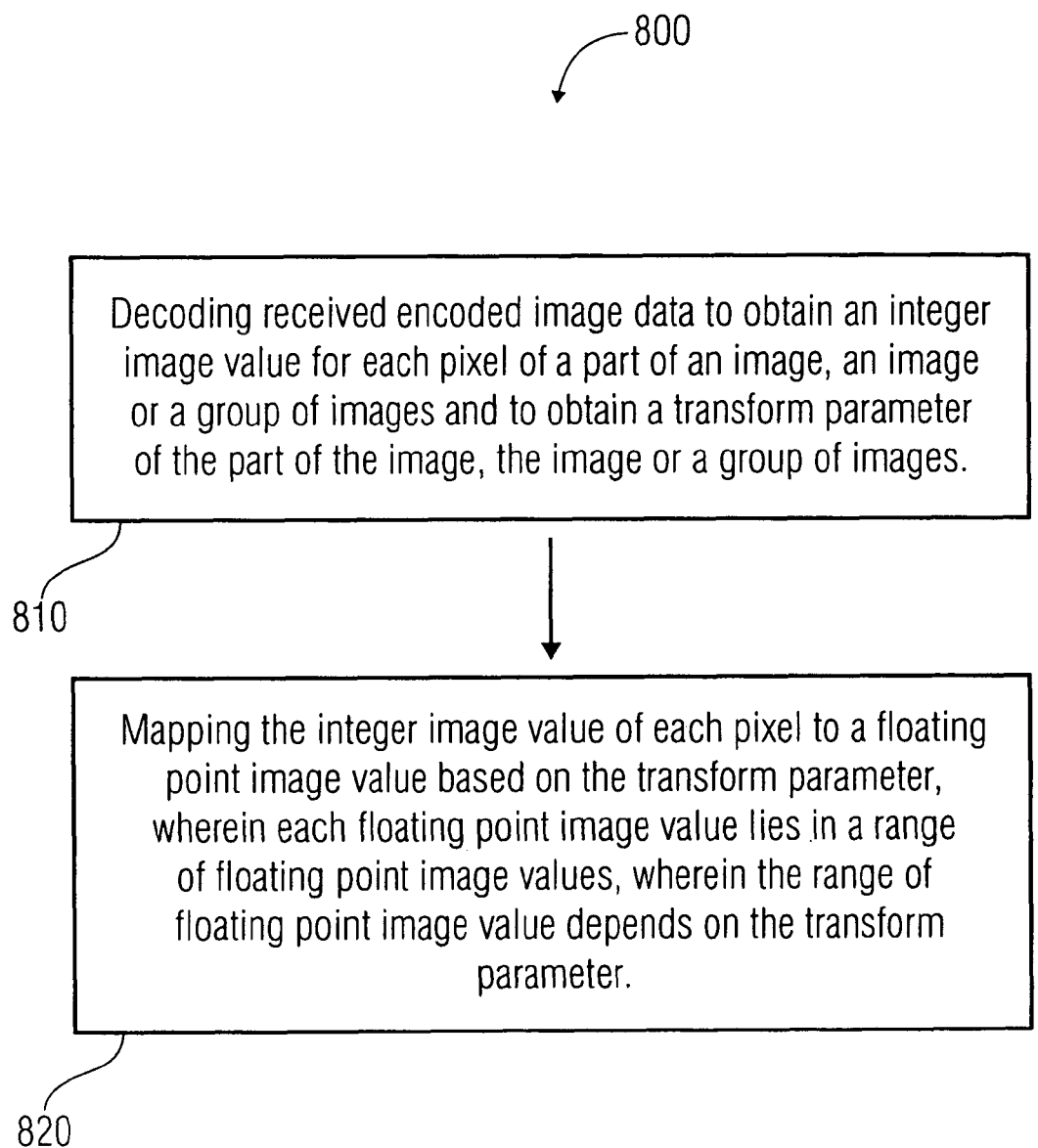
FIG. 8 is a flow chart of a method for decoding image data.

FIG. 8 shows a flow chart of a method 800 for decoding image data according to an embodiment of the invention. The method 800 comprises decoding 810 received encoded image data to obtain an integer image value for each pixel of a part of an image, an image or a group of images and to obtain a transform parameter of the part of the image, the image or the group of images. Further, the method 800 comprises mapping 820 the integer image value of each pixel to a floating point image value based on the transform parameter. Each floating point image value lies in a range of floating point image values. The range of floating point image values depends on the transform parameter.

Additionally, the method 800 may comprise further optional steps described in connection with image decoders.

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive encoded image data can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Image encoder comprising:
    a color space converter configured to transform device dependent floating point image data to device independent floating point image data, wherein the device dependent floating point image data includes values of three floating point parameters for each pixel and the device independent floating point data includes a floating point luminance image value and two floating point chrominance image values for each pixel;
    an extreme value determiner configured to determine a minimal value and a maximal value of the floating point luminance image value of each pixel of a part of an image, an image or a group of images;
    a floating point-to-integer converter configured to implement an adaptive floating point-to-integer mapping, wherein only the floating point luminance image value of each pixel is adaptively mapped to an integer luminance image value, wherein each integer luminance image value lies in a predefined range of integer luminance image values, while the chrominance image values for each pixel are non-adaptively mapped, wherein the determined minimal floating point luminance image value is mapped to a minimal integer luminance image value of the predefined range of integer luminance image values and the determined maximal floating point luminance image value is mapped to a maximal integer luminance image value of the predefined range of integer luminance image values,
    wherein the floating point-to-integer converter is configured to calculate at least one transform parameter for the part of the image, the image or the group of images based on the determined minimal floating point value and the determined maximal floating point value, wherein the floating point value of each pixel of the part of the image, the image or the group of images is mapped based on the transform parameter; and
    an encoder configured to encode the integer luminance image value of each pixel to acquire and provide encoded image data of the part of the image, the image or the group of images,
    wherein the transform parameter is provided with the encoded image data of the part of the image, the image or the group of images.

2. Image encoder according to claim 1, wherein the extreme value determiner is configured to determine a minimal value and a maximal value for each part of an image, for each image of a group of images or for each group of images of an image sequence.

3. Image encoder according to claim 1, wherein the floating point-to-integer converter is configured to determine a logarithmic value of the floating point luminance image value of each pixel and configured to map the logarithmic floating point luminance image values to the integer luminance image values, so that the floating point luminance image values are distributed logarithmically through the range of integer luminance image values, and wherein the determined minimal value is a minimal positive value of the floating point luminance image values.

4. Image encoder according to claim 1, comprising a color space converter configured to calculate the floating point luminance image value and two floating point chrominance image values for each pixel based on RGB data of each pixel according to the following equation:

$$\begin{bmatrix} X \\ Y \\ Z \end{bmatrix} = \begin{bmatrix} 0.497 & 0.339 & 0.164 \\ 0.256 & 0.678 & 0.066 \\ 0.023 & 0.113 & 0.864 \end{bmatrix} \begin{bmatrix} R \\ G \\ B \end{bmatrix}$$

$$x = \frac{X}{X+Y+Z}$$

$$y = \frac{Y}{X+Y+Z}$$

wherein R, G and B are color space parameters of a device dependent color space, X and Z are color space parameters of a device independent color space, Y is the floating point luminance image value and x and y are two floating point chrominance image values of a device independent color space, wherein the floating point-to-integer converter is configured to determine the integer luminance image values for each pixel according to the following equations:

$$L = \begin{cases} 0, & \text{when } Y = 0 \\ \lfloor a(\log_2 Y + b) \rfloor, & \text{otherwise} \end{cases}$$

$$a = \frac{2^{n_L} - 2}{\log_2(\max(Y)/\min\_positive(Y))}$$

$$b = \frac{1}{a} - \log_2(\min\_positive(Y))$$

wherein L is the integer luminance image value, a and b are transform parameters, and $n_L$ is the number of bits per pixel of the integer luminance image value, and configured to determine two integer chrominance image values for each pixel based on the two calculated floating point chrominance image values according to equations:

$$u_e = \left\lfloor c \frac{4x}{-2x+12y+3} \right\rfloor$$

$$v_e = \left\lfloor c \frac{9y}{-2x+12y+3} \right\rfloor$$

$$c = \frac{2^{n_c} - 1}{0.62}$$

wherein $u_e$ and $v_e$ are two integer chrominance image values, c is a transform parameter and $n_c$ is the number of bits per pixel of a integer chrominance image value, and wherein the encoder is configured to encode the integer luminance image value and the two integer chrominance image values of each pixel to acquire and provide the encoded image data of the part of the image, the image or the group of images.

5. Image decoder comprising:
a decoder configured to decode received encoded device independent image data to acquire an integer luminance image value for each pixel of a part of an image, an image or a group of images and to acquire a transform parameter of the part of the image, the image or the group of images, wherein the integer luminance image value of each pixel includes a luminance value and chrominance values of each pixel;
an integer-to-floating point converter configured to map the integer luminance image value of each pixel to a floating point luminance image value based on the transform parameter, wherein each floating point luminance image value lies in a range of floating point luminance image values, wherein the range of the floating point luminance image values depends on the transform parameter; and
a color space converter configured to transform device independent floating point image data to device dependent floating point image data, wherein the device independent floating point image data includes a floating point luminance image value and two floating point chrominance image values for each pixel and the device dependent floating point image data includes values of three floating point parameters for each pixel;
wherein the received encoded device independent image data is encoded by an image encoder comprising:
a color space converter configured to transform device dependent floating point image data to device independent floating point image data, wherein the device dependent floating point image data comprises values of three floating point parameters for each pixel and the device independent floating point data comprises the floating point luminance image value and two floating point chrominance image values for each pixel;
an extreme value determiner configured to determine a minimal value and a maximal value of the floating point luminance image value of each pixel of a part of an image, an image or a group of images;
a floating point-to-integer converter configured to implement an adaptive floating point-to-integer mapping, wherein only the floating point luminance image value of each pixel is adaptively mapped to an integer luminance image value, wherein each integer image value lies in a predefined range of integer image values, while the chrominance image values for each pixel are non-adaptively mapped, wherein the determined minimal floating point image value is mapped to a minimal integer image value of the predefined range of integer image values and the determined maximal floating point image value is mapped to a maximal integer image value of the predefined range of integer image values;
wherein the floating point-to-integer converter is configured to calculate at least one transform parameter for the part of the image, the image or the group of images based on the determined minimal floating point value and the determined maximal floating point value, wherein the floating point value of each pixel of the part of the image, the image or the group of images is mapped based on the transform parameter; and
an encoder configured to encode the integer image value of each pixel to acquire and provide encoded image data of the part of the image, the image or the group of images;

wherein the transform parameter is provided with the encoded image data of the part of the image, the image or the group of images.

6. Image decoder according to claim 5, wherein the integer-to-floating point converter is configured to determine a floating point luminance image value for a pixel based on an exponentiation, wherein the exponent of the exponentiation is based on the corresponding integer luminance image value of the pixel and the transform parameter of the part of the image, the image or the group of images.

7. Image decoder according to claim 5, comprising a color space converter, wherein the integer-to-floating point converter is configured to determine the floating point luminance image values for each pixel according to the following equations:

$$Y = \begin{cases} 0, & when\, L = 0 \\ 2^{(\frac{L+0.5}{a})-b}, & \text{otherwise} \end{cases}$$

$$a = \frac{2^{n_L} - 2}{\log_2(\max(Y)/\min\_positive(Y))}$$

$$b = \frac{1}{a} - \log_2(\min\_positive(Y))$$

wherein L is the integer luminance image value, Y is the floating point luminance image value, a and b are transform parameters, and $n_L$ is the number of bits per pixel of the integer luminance image value,
and configured to determine two floating point chrominance image values (x, y) for each pixel based on two decoded integer chrominance image values ($u_e$, $v_e$) according to equations:

$$u = \frac{u_e + 0.5}{c}$$

$$v = \frac{v_e + 0.5}{c}$$

$$x = \frac{9u}{6u - 16v + 12}$$

$$y = \frac{4v}{6u - 16v + 12}$$

$$c = \frac{2^{n_c} - 1}{0.62}$$

wherein $u_e$ and $v_e$ are the two integer chrominance image values, c is a transform parameter, x and y are the two floating point chrominance image values of a device independent color space, u and v are two floating point chrominance image values and $n_c$ is the number of bits per pixel of a integer chrominance image value,
and wherein the color space converter) is configured to calculate device dependent RGB data of each pixel based on the floating point luminance image value and the two floating point chrominance image values of each pixel according to the following equations:

$$X = \frac{Yx}{y}$$

$$Z = \frac{Y(1 - x - y)}{y}$$

-continued $$\begin{bmatrix} R \\ G \\ B \end{bmatrix} = \begin{bmatrix} 2.690 & -1.276 & -0.414 \\ -1.022 & 1.978 & 0.044 \\ 0.061 & -0.224 & 1.163 \end{bmatrix} \begin{bmatrix} X \\ Y \\ Z \end{bmatrix}$$

wherein R, G and B are color space parameters of a device dependent color space and X and Z are color space parameters of a device independent color space.

8. Method for providing encoded image data, comprising:
transforming device dependent floating point image data to device independent floating point image data, wherein the device dependent floating point image data includes values of three floating point parameters for each pixel and the device independent floating point image data includes a floating point luminance image value and two floating point chrominance image values for each pixel;
determining a minimal value and a maximal value of the floating point luminance image value of each pixel of a part of an image, an image or a group of images;
calculating at least one transform parameter for the part of the image, the image or the group of images based on the determined minimal floating point value and the determined maximal floating point value;
adaptive floating point-to-integer mapping only the floating point luminance image value of each pixel to an integer luminance image value, while the chrominance image values for each pixel are non-adaptively mapped, wherein each integer luminance image value lies in a predefined range of integer luminance image values, wherein the determined minimal floating point luminance image value is mapped to a minimal integer luminance image value of the predefined range of integer luminance image values and the determined maximal floating point luminance image value is mapped to a maximal integer luminance image value of the predefined ranged of integer luminance image values,
wherein the floating point value of each pixel of the part of the image, the image or the group of images is mapped based on the transform parameter;
encoding the integer luminance image value of each pixel to acquire encoded image data of the part of the image, the image or the group of images; and
providing the encoded image data,
wherein the transform parameter is provided with the encoded image data of the part of the image, the image or the group of images.

9. Method for decoding image data, comprising:
decoding received encoded device independent image data to acquire an integer luminance image value for each pixel of a part of an image, an image or a group of images and to acquire a transform parameter of the part of the image, the image or the group of images, wherein the integer luminance image value of each pixel includes a luminance value and chrominance values of each pixel;
mapping the integer luminance image value of each pixel to a floating point luminance image value based on the transform parameter, wherein each floating point luminance image value lies in a range of floating point luminance image values, wherein the range of floating point luminance image value depends on the transform parameter; and transforming device independent floating point image data to device dependent floating point image data, wherein the device independent floating point image data includes the floating point luminance image value and the floating point chrominance image values for each pixel and the device dependent floating point image data includes values of three floating point parameters for each pixel;
wherein the received encoded device independent image data is encoded by:
transforming device dependent floating point image data to device independent floating point image data, wherein the device dependent floating point image data comprises values of three floating point parameters for each pixel and the device independent floating point data comprises the floating point luminance image value and two floating point chrominance image values for each pixel;
determining a minimal value and a maximal value of a floating point luminance image value of each pixel of a part of an image, an image or a group of images;
calculating at least one transform parameter for the part of the image, the image or the group of images based on the determined minimal floating point value and the determined maximal floating point value;
adaptive floating point-to-integer mapping only the floating point luminance image value of each pixel to an integer luminance image value, while the chrominance image values for each pixel are non-adaptively mapped, wherein each integer image value lies in a predefined range of integer image values, wherein the determined minimal floating point image value is mapped to a minimal integer image value of the predefined range of integer image values and the determined maximal floating point image value is mapped to a maximal integer image value of the predefined ranged of integer image values;
wherein the floating point value of each pixel of the part of the image, the image or the group of images is mapped based on the transform parameter;
encoding the integer image value of each pixel to acquire encoded image data of the part of the image, the image or the group of images; and
providing the encoded image data;
wherein the transform parameter is provided with the encoded image data of the part of the image, the image or the group of images.

10. A non-transitory computer-readable medium including a computer program with a program code for performing, when the computer program runs on a computer or a microcontroller, the method for providing encoded image data, the method comprising:
transforming device dependent floating point image data to device independent floating point image data, wherein the device dependent floating point image data includes values of three floating point parameters for each pixel and the device independent floating point data includes the floating point luminance image value and two floating point chrominance image values for each pixel;
determining a minimal value and a maximal value of the floating point luminance image value of each pixel of a part of an image, an image or a group of images;
calculating at least one transform parameter for the part of the image, the image or the group of images based on the determined minimal floating point value and the determined maximal floating point value;

adaptive floating point-to integer mapping only the floating point luminance image value of each pixel to an integer luminance image value, while the chrominance image values for each pixel are non-adaptively mapped, wherein each integer luminance image value lies in a predefined range of integer luminance image values, wherein the determined minimal floating point luminance image value is mapped to a minimal integer luminance image value of the predefined range of integer luminance image values and the determined maximal floating point luminance image value is mapped to a maximal integer luminance image value of the predefined ranged of integer luminance image values, wherein the floating point value of each pixel of the part of the image, the image or the group of images is mapped based on the transform parameter;

encoding the integer luminance image value of each pixel to acquire encoded image data of the part of the image, the image or the group of images; and providing the encoded image data, wherein the transform parameter is provided with the encoded image data of the part of the image, the image or the group of images.

11. A non-transitory computer-readable medium including a computer program with a program code for performing, when the computer program runs on a computer or a microcontroller, the method for decoding image data, the method comprising:

decoding received encoded device independent image data to acquire an integer luminance image value for each pixel of a part of an image, an image or a group of images and to acquire a transform parameter of the part of the image, the image or the group of images, wherein the integer luminance image value of each pixel includes a luminance value and chrominance values of each pixel; and mapping the integer luminance image value of each pixel to a floating point luminance image value based on the transform parameter, wherein each floating point luminance image value lies in a range of floating point luminance image values, wherein the range of floating point luminance image value depends on the transform parameter; and transforming device independent floating point image data to device dependent floating point image data, wherein the device independent floating point image data includes the floating point luminance image value and the floating point chrominance image values for each pixel and the device dependent floating point image data includes values of three floating point parameters for each pixel;

wherein the received encoded device independent image data is encoded by:

transforming device dependent floating point image data to device independent floating point image data, wherein the device dependent floating point image data comprises values of three floating point parameters for each pixel and the device independent floating point data comprises the floating point luminance image value and two floating point chrominance image values for each pixel;

determining a minimal value and a maximal value of a floating point luminance image value of each pixel of a part of an image, an image or a group of images;

calculating at least one transform parameter for the part of the image, the image or the group of images based on the determined minimal floating point value and the determined maximal floating point value;

adaptive floating point-to-integer mapping only the floating point luminance image value of each pixel to an integer luminance value, while the chrominance image values for each pixel are non-adaptively mapped, wherein each integer image value lies in a predefined range of integer image values, wherein the determined minimal floating point image value is mapped to a minimal integer image value of the predefined range of integer image values and the determined maximal floating point image value is mapped to a maximal integer image value of the predefined ranged of integer image values;

wherein the floating point value of each pixel of the part of the image, the image or the group of images is mapped based on the transform parameter;

encoding the integer image value of each pixel to acquire encoded image data of the part of the image, the image or the group of images; and providing the encoded image data;

wherein the transform parameter is provided with the encoded image data of the part of the image, the image or the group of images.

12. Image encoder according to claim 1, wherein the number of bits per pixel of the integer luminance image value is higher than the number of bits per pixel of an integer chrominance image value.

13. Image decoder according to claim 5, wherein the number of bits per pixel of the integer luminance image value is higher than the number of bits per pixel of an integer chrominance image value.

* * * * *